United States Patent
Won et al.

(10) Patent No.: US 11,276,536 B2
(45) Date of Patent: Mar. 15, 2022

(54) POWER RELAY ASSEMBLY

(71) Applicant: AMOGREENTECH CO., LTD., Gimpo-si (KR)

(72) Inventors: Min Ho Won, Incheon (KR); Seung Jae Hwang, Incheon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 246 days.

(21) Appl. No.: 16/468,018

(22) PCT Filed: Dec. 15, 2017

(86) PCT No.: PCT/KR2017/014834
§ 371 (c)(1),
(2) Date: Jun. 10, 2019

(87) PCT Pub. No.: WO2018/111031
PCT Pub. Date: Jun. 21, 2018

(65) Prior Publication Data
US 2020/0013573 A1     Jan. 9, 2020

(30) Foreign Application Priority Data

Dec. 15, 2016    (KR) ........................ 10-2016-0171568

(51) Int. Cl.
*H01H 45/04*     (2006.01)
*H01H 45/12*     (2006.01)
*B60R 16/02*     (2006.01)
(Continued)

(52) U.S. Cl.
CPC ............. *H01H 45/12* (2013.01); *B60R 16/02* (2013.01); *H01H 45/04* (2013.01); *H02B 1/46* (2013.01);
(Continued)

(58) Field of Classification Search
CPC ........ H01H 45/04; H01H 45/12; H01H 50/02; H01H 50/12; H02B 1/46; H05K 1/0201;
(Continued)

(56) References Cited

U.S. PATENT DOCUMENTS

2015/0223317 A1*   8/2015   Oi ........................ H05K 1/0298
361/709

FOREIGN PATENT DOCUMENTS

JP    H04-137431 U    12/1992
JP    H08-223739 A    8/1996
(Continued)

*Primary Examiner* — Ramon M Barrera
(74) *Attorney, Agent, or Firm* — Rothwell, Figg, Ernst & Manbeck, P C.

(57) ABSTRACT

A power relay assembly is provided. A power relay assembly according to an exemplary embodiment of the present invention comprises: an upper case having at least one electric element mounted on one surface thereof; a lower case coupled to the upper case; and at least one bus bar electrically connected to the electric element, disposed between the upper case and the lower case, and including a bottom portion that is in surface contact with at least one of the upper case and the lower case, wherein at least one side of the bottom portion contacts a portion made of a plastic material having heat dissipation and insulation properties in the upper case and the lower case.

10 Claims, 9 Drawing Sheets

(51) Int. Cl.
*H02G 5/06* (2006.01)
*H02B 1/46* (2006.01)
*H05K 1/02* (2006.01)
*H05K 1/18* (2006.01)
*B60R 16/023* (2006.01)
*H05K 1/03* (2006.01)

(52) U.S. Cl.
CPC ............ *H02G 5/06* (2013.01); *H05K 1/0207* (2013.01); *H05K 1/0209* (2013.01); *H05K 1/181* (2013.01); *B60R 16/0238* (2013.01); *B60Y 2200/91* (2013.01); *H05K 1/0373* (2013.01); *H05K 2201/0129* (2013.01); *H05K 2201/10022* (2013.01); *H05K 2201/10053* (2013.01); *H05K 2201/10151* (2013.01); *H05K 2201/10181* (2013.01)

(58) Field of Classification Search
CPC ... H05K 1/0207; H05K 1/0209; H05K 1/0373
See application file for complete search history.

(56) References Cited

FOREIGN PATENT DOCUMENTS

| | | |
|---|---|---|
| JP | H08275338 A | 10/1996 |
| JP | 2000-115956 A | 4/2000 |
| JP | 2000115956 A | 4/2000 |
| JP | 2002-171050 A | 6/2002 |
| JP | 2005006365 A | 1/2005 |
| JP | 2005-142256 A | 6/2005 |
| JP | 2005295723 A | 10/2005 |
| JP | 2006-187122 A | 7/2006 |
| JP | 2008178240 A | 7/2008 |
| JP | 2009033088 A | 2/2009 |
| KR | 101297487 B1 | 8/2013 |
| KR | 20140095320 A | 8/2014 |
| WO | 2009-069308 A1 | 4/2011 |
| WO | 2016-114099 A1 | 7/2016 |

\* cited by examiner

POWER RELAY ASSEMBLY

CROSS REFERENCE TO RELATED APPLICATION

This application is a 35 U.S.C. 371 National Phase Entry Application from PCT/KR2017/014834, filed Dec. 15, 2017, which claims the benefit of Korean Patent Application No. 10-2016-0171568, filed on Dec. 15, 2016, the disclosures of which are incorporated herein in their entirety by reference.

TECHNICAL FIELD

The present invention relates to a power relay assembly, and more specifically, to a power relay assembly usable in an electric vehicle, for example.

BACKGROUND ART

An electric vehicle is a generic term for vehicles driven using electricity. Generally, electric vehicles are classified into electric vehicles (EV) driven by only electricity, hybrid electric vehicles (HEV) using electricity and fossil fuel, and the like.

In an electric vehicle, a power relay assembly is located between a high-voltage battery and a motor. The above-described power relay assembly serves to selectively supply power from the high-voltage battery.

That is, the power relay assembly includes a main relay, a pre-charge relay, a pre-charge resistor, and the like, and the above-described components are electrically connected to each other through a bus bar.

The main relay supplies or blocks the power between the high-voltage battery and the motor, and the pre-charge relay and the pre-charge resistor prevent damage to an apparatus due to initial currents.

Further, the bus bar is a conductor having low impedance and a large current capacity, and can individually connect at least two circuits or can connect several isoquant points in one system.

Generally, the power relay assembly is installed in a trunk or a cabin room in order to be connected to the high-voltage battery installed in the trunk. Accordingly, heat dissipation performance of the main relay or the pre-charge relay should be secured to prevent performance degradation and damage due to heat.

DISCLOSURE

Technical Problem

The present invention is directed to providing a power relay assembly capable of securing a heat dissipation performance.

Further, the present invention is directed to providing a power relay assembly in which a material used for a bus bar is changed to secure a desired heat dissipation performance and promote lightening and cost reduction.

Technical Solution

One aspect of the present invention provides a power relay assembly including: an upper case in which at least one electric element is mounted on one surface thereof; a lower case coupled to the upper case; and at least one bus bar electrically connected to the electric element, disposed between the upper case and the lower case, and including a bottom portion in surface contact with at least one of the upper case and the lower case, wherein at least one surface of the bottom portion is in contact with a portion formed of a plastic material having a heat dissipation property and an insulation property between the upper case and the lower case.

Further, the upper case and the lower case may be formed of a plastic material having a heat dissipation property and an insulation property, and at least of the bottom portion may be in surface contact with any one of an inner surface of the upper case and an inner surface of the lower case. Accordingly, heat generated from the bus bar may be easily released through a contact surface.

In addition, when a plurality of bus bars are provided and some bus bars among the plurality of bus bars are disposed at a partially overlapping location, an inner plate may be included to insulate the overlapping bus bars. In these circumstances, bottom portions of the overlapping bus bars may be in surface contact with the inner plate and the inner plate may be formed of a plastic material having a heat dissipation property and an insulation property to improve heat dissipation performance.

In addition, at least one of the upper case and the lower case may include a plate-shaped metal member to reinforce structural strength and improve a heat dissipation property.

In addition, since a coating layer having an insulation property and a heat dissipation property is formed on an exposed surface of the power relay assembly, the above-described power relay assembly may further improve the heat dissipation performance.

In addition, the bus bar may be formed of an aluminum material in which the coating layer having an insulation property and a heat dissipation property is formed on a surface thereof to secure a desired heat dissipation performance and promote lightening and cost reduction.

Meanwhile, another aspect of the present invention provides a power relay assembly including: an upper case in which a plurality of electric elements are mounted on one surface thereof; a lower case coupled to the upper case; a plate-shaped inner plate disposed between the upper case and the lower case; and a plurality of bus bars electrically connected to the electric elements and including bottom portions each having both surfaces in surface contact with the upper case and the inner plate or the inner plate and a lower plate, wherein at least one surface of the bottom portion is in contact with a portion formed of a plastic material having a heat dissipation property and an insulation property. In this case, the upper case, the lower case, and the inner plate may be formed of a plastic material having a heat dissipation property and an insulation property.

Advantageous Effects

According to the present invention, since a portion in surface contact with a bus bar is formed of a material having a heat dissipation property and an insulation property, heat generated from the bus bar can be quickly dispersed. Accordingly, performance degradation and damage of components due to heat can be prevented in advance.

Further, in the present invention, since the bus bar is formed of a coating layer having a heat dissipation property on a surface thereof, a desired heat dissipation performance can be secured, lightening can be performed, and production costs can be reduced.

MODES OF THE INVENTION

Hereinafter, exemplary embodiments of the present invention will be described in detail with reference to the accompanying drawings which may allow one of ordinary skill in the art to easily perform the present invention. The present invention may be implemented in various forms and is not limited to the following embodiments. Components not related to the description are not included in the drawings to clearly describe the present invention, and the same reference symbols are used for the same or similar components in the description.

Figure 1:
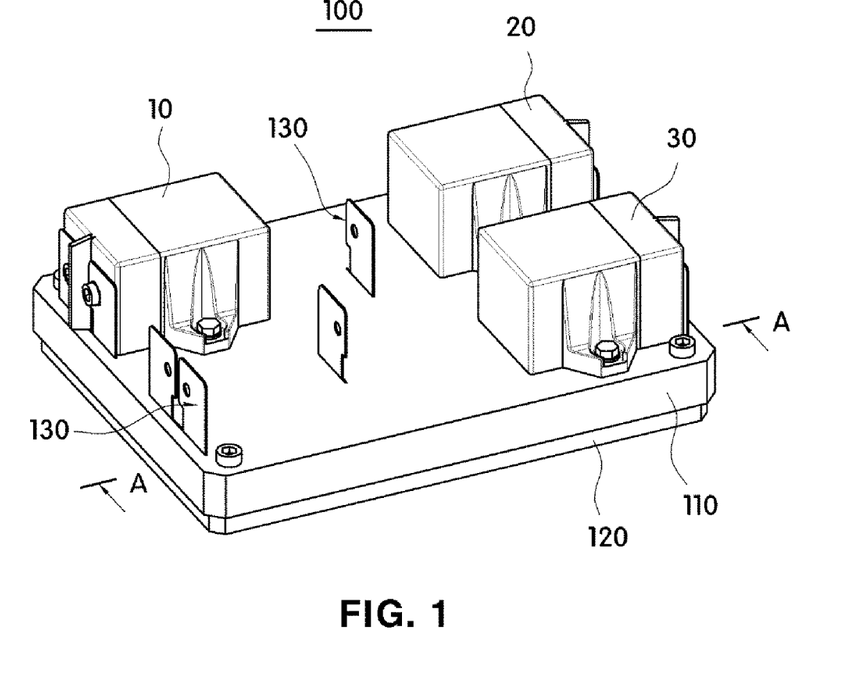
FIG. 1 is a schematic view illustrating a power relay assembly according to an embodiment of the present invention.
Figure 9:
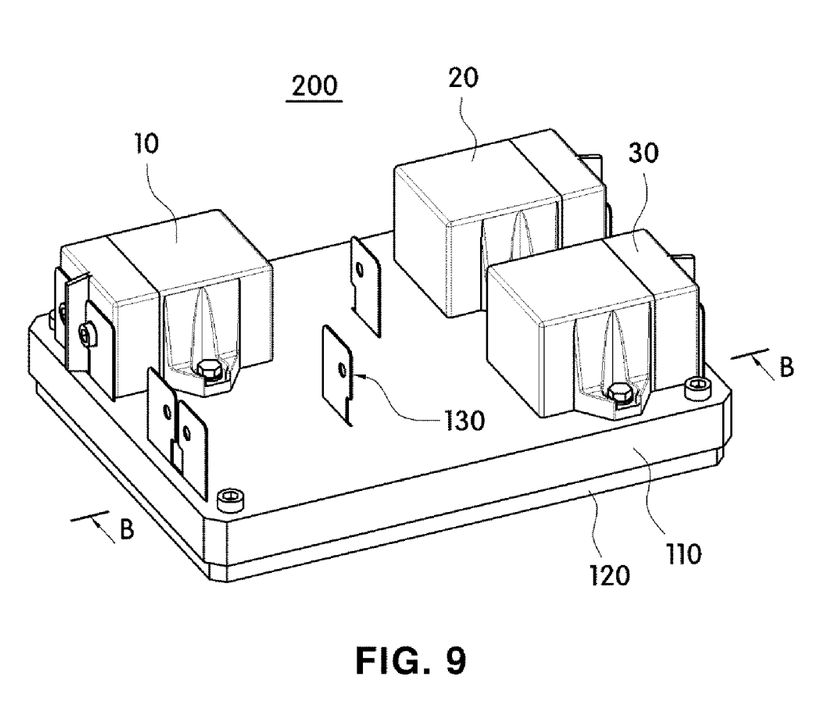
FIG. 9 is a schematic view illustrating a power relay assembly according to another embodiment of the present invention.

Power relay assemblies 100 and 200 according to an embodiment of the present invention are provided to supply power to a driving control part configured to block or connect high-voltage currents supplied from a battery to control a driving voltage, and as shown in FIGS. 1 and 9, include at least one electric element 10, 20, and 30, an upper case 110, lower cases 120 and 220, and a bus bar 130.

The at least one electric element 10, 20, and 30 may be mounted on one surface of the upper case 110 and may be electrically connected to each other through the bus bar 130.

Accordingly, the electric elements 10, 20, and 30 may serve to block or connect the high-voltage currents supplied from the battery to the driving control part.

The above-described electric elements 10, 20, and 30 may be main relays, pre-charge relays, pre-charge resistors, battery current sensors, main fuses, and the like and may be electrically connected to each other through the bus bar 130 or a cable (not shown). Further, in a case in which a plurality of bus bars 130 are provided, the plurality of bus bars 130 may be electrically connected to each other through circuit patterns (not shown) formed on one surface of the lower cases 120 and 220.

Accordingly, the electric elements 10, 20, and 30 may supply power to a driving control part (not shown) configured to control a driving voltage by blocking or connecting the high-voltage currents supplied from the battery to generate control signals for driving a motor in the driving control part. In this case, the driving control part may generate control signals for driving the motor, and since an inverter and a converter are controlled through the control signals, driving of the motor may be controlled.

As an example, since the main relays adopt a connected state and the pre-charge relays are blocked when a vehicle is driven, the power from the battery may be applied to the inverter through a main circuit.

Further, since the main relays become a blocked state and connection between the battery and the inverter is blocked when the vehicle is turned off, a battery voltage may be prevented from being transferred to the motor through the inverter. In this case, when the main relays are blocked, a condenser connected to the inverter may be discharged.

Further, when the vehicle is driven again, since the pre-charge relays are connected and thus the battery voltage is applied to the inverter in a lowered state by a pre-charge resistor, charging of the condenser may be started. In addition, when the condenser is sufficiently charged, since the main relays are connected and the pre-charge relays are blocked, the battery voltage may be supplied to the inverter.

Since the operation of the above-described electric elements is publically known, detailed descriptions thereof will not be provided.

Figure 2:
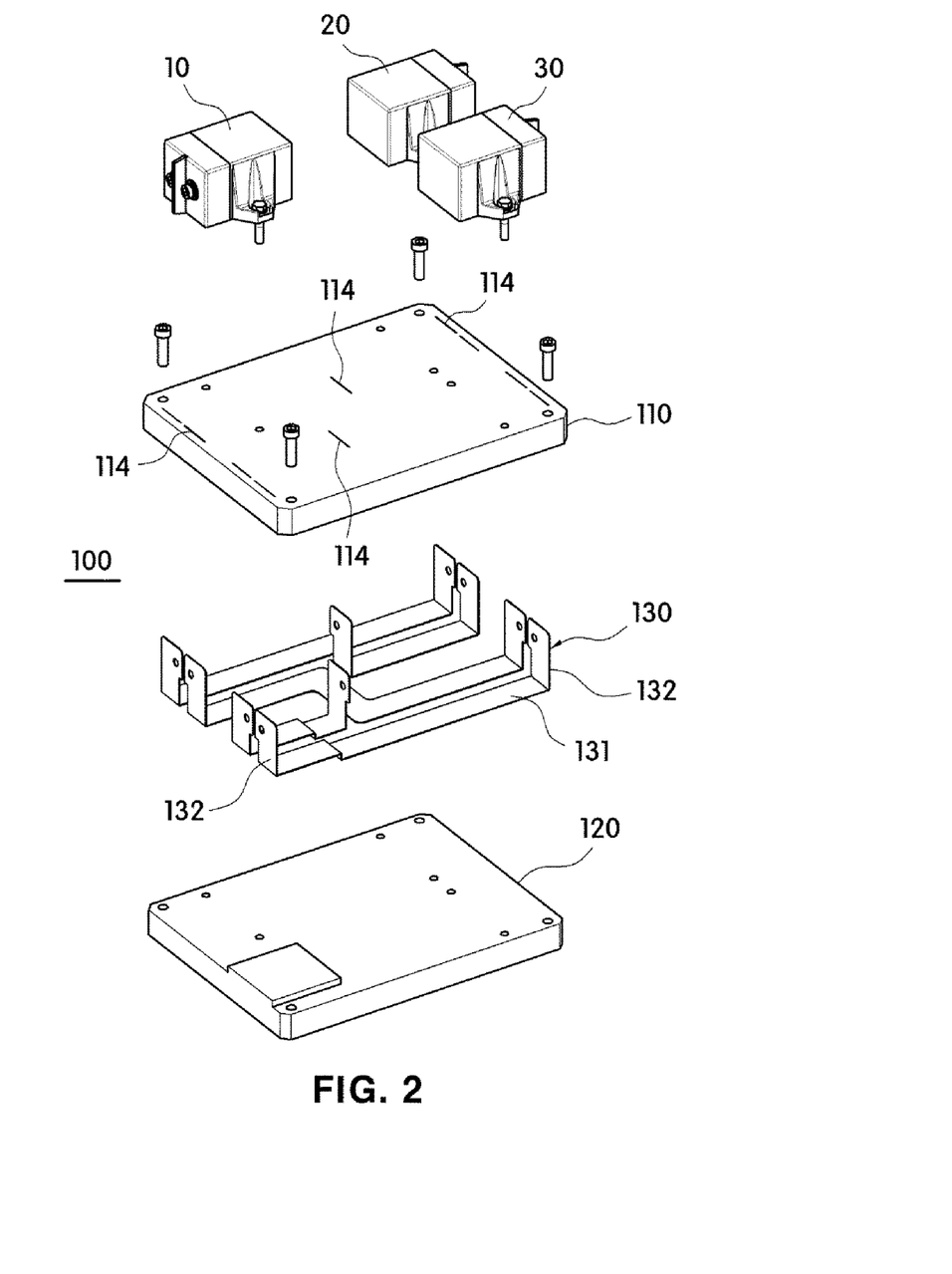
FIG. 2 is an exploded view of FIG. 1.
Figure 10:
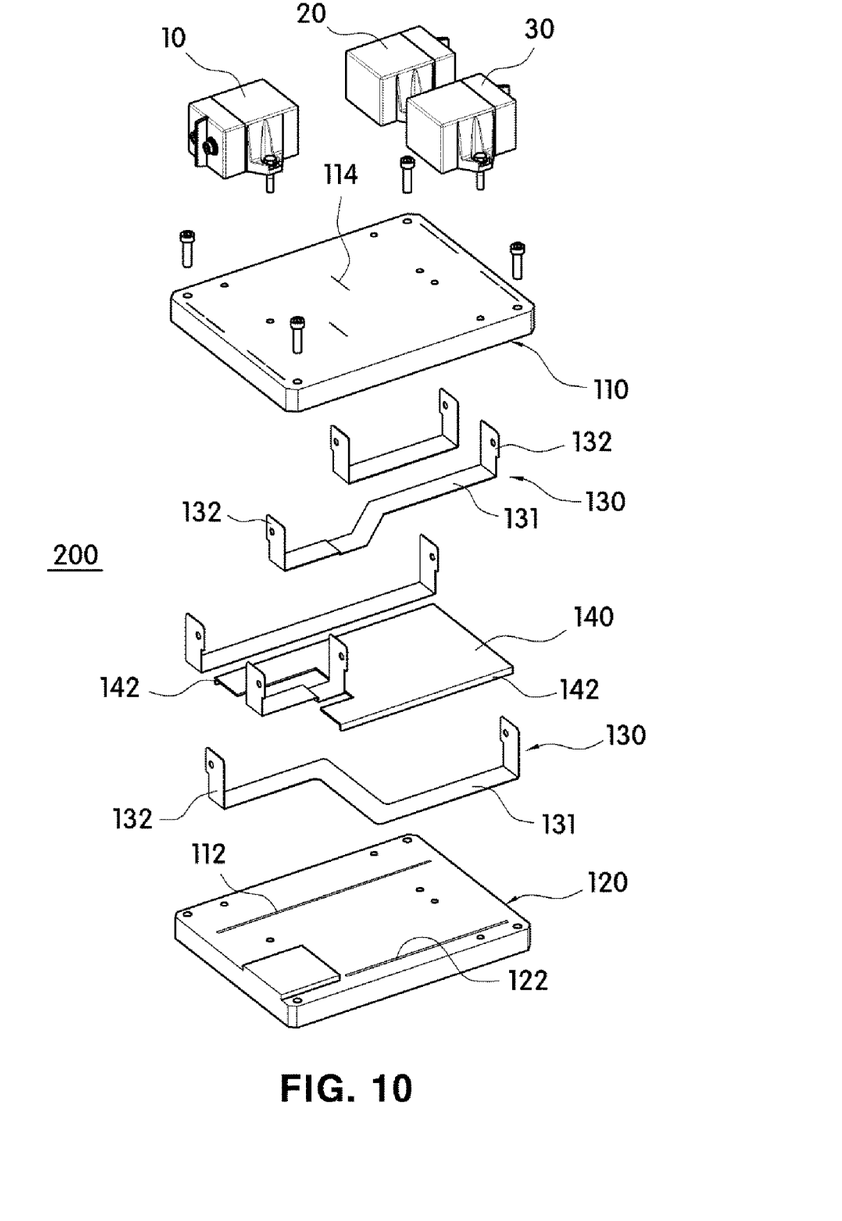
FIG. 10 is an exploded view of FIG. 9.

The upper case 110 and the lower cases 120 and 220 may fix the bus bars 130 when being coupled to each other. To this end, as shown in FIGS. 2 and 10, the upper case 110 and the lower cases 120 and 220 may be detachably coupled to each other, and parts of the bus bars 130 may be disposed between inner surfaces facing each other.

That is, the bus bars 130 may include at least a portion disposed between the upper case 110 and the lower cases 120 and 220, and may be fixed through the portions disposed between the upper case 110 and the lower cases 120 and 220 when the upper case 110 and the lower cases 120 and 220 are coupled.

Figure 3:
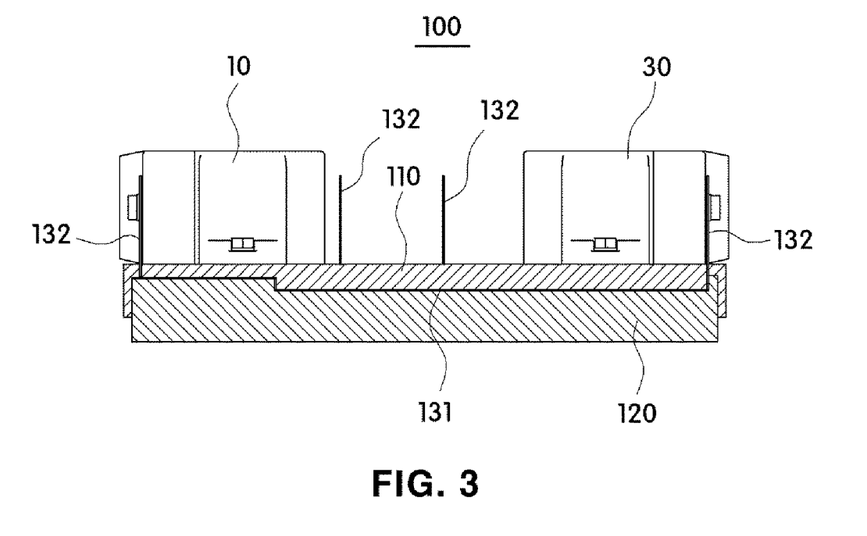
FIG. 3 is a cross-sectional view of a direction A-A in FIG. 1.
Figure 11:
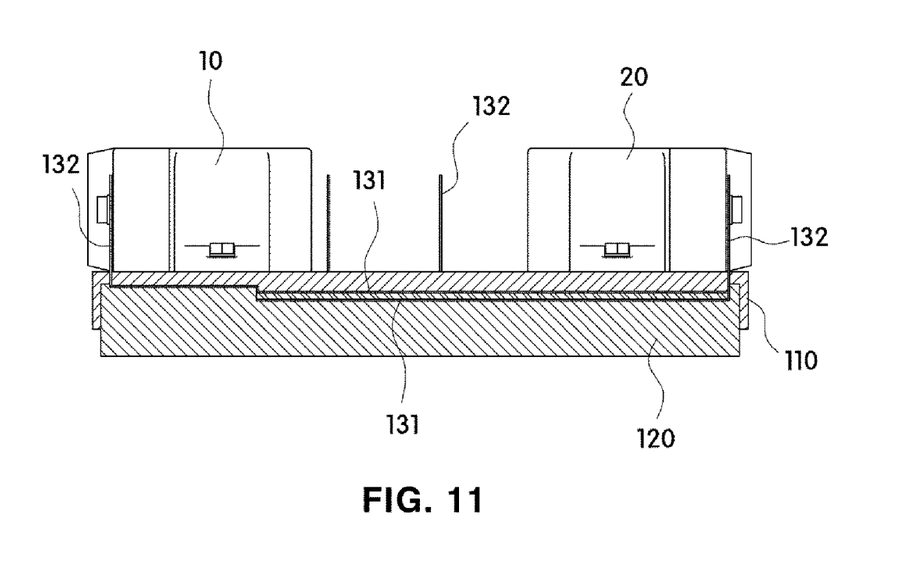
FIG. 11 is a cross-sectional view of a direction B-B in FIG. 9.

As an example, as shown in FIGS. 3 and 11, each of the bus bars 130 may include a plate-shaped bottom portion 131 having a predetermined area and length and the bottom portion 131 may be disposed between the upper case 110 and the lower cases 120 and 220.

In this case, at least a portion of the upper case 110 or the lower cases 120 and 220 may have both a heat dissipation property and an insulation property, and at least one surface of the bottom portion 131 of the bus bar may be in surface contact with a portion formed of a plastic material having a heat dissipation property and an insulation property among the upper case 110 or the lower cases 120 and 220.

Accordingly, at least a portion of the bus bar 130 may be fixed in a shape buried inside a coupled body in which the upper case 110 and the lower cases 120 and 220 are coupled, and since the portion of the bus bar 130 buried inside the coupled body is in surface contact with the portion having a heat dissipation property, heat generated when the at least one among the electric elements 10, 20, and 30 is operated may be dispersed or released after being transferred to the portion having a heat dissipation property.

In the present invention, the at least one among the electric elements 10, 20, and 30 may be mounted on one surface of the upper case 110 and may be connected to the portion of the bus bar 130 configured to protrude to an outer side of the upper case 110.

Meanwhile, the upper case 110 and the lower cases 120 and 220 may be formed of a plastic material, and at least one of the upper case 110 and the lower cases 120 and 220 may be formed of a plastic material having a heat dissipation property and an insulation property. Further, in the bottom portion 131 of the bus bar, one surface of both surfaces may be in surface contact with one surface of the upper case 110 or the lower cases 120 and 220 or both surfaces may be in surface contact with one surface of the upper case 110 and one surface of the lower cases 120 and 220.

Figure 5:
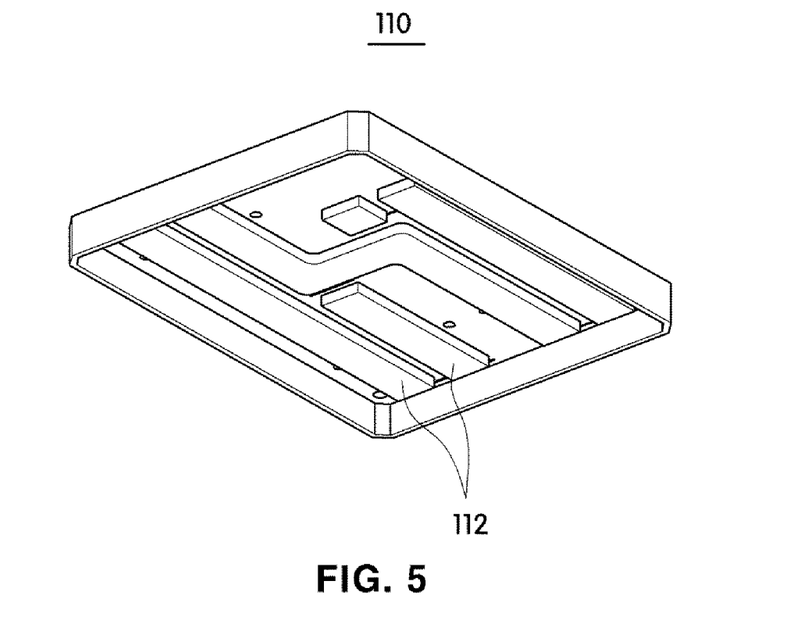
FIG. 5 is a view of the upper case in FIG. 1 from below.
Figure 13:
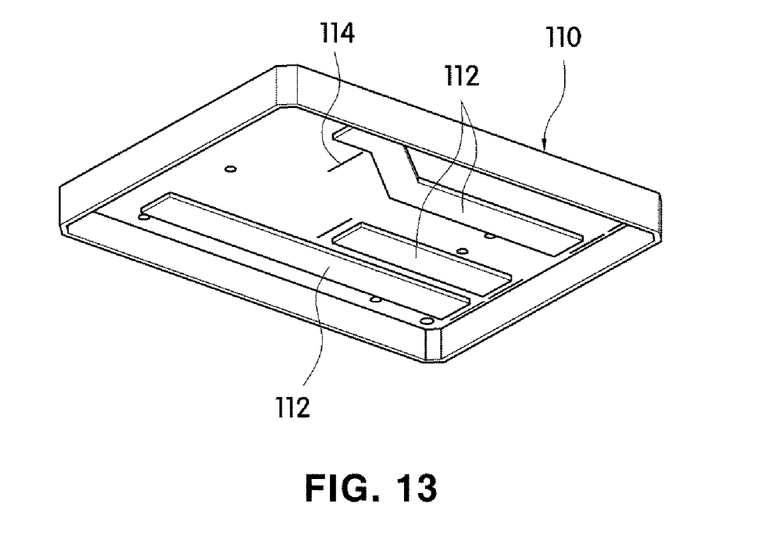
FIG. 13 is a view of the upper case in FIG. 9 from below.

Here, as shown in FIGS. 5 and 13, an inner surface of the upper case 110 in contact with the bottom portion 131 may include a protruding portion 112 formed to protrude by a predetermined height. Accordingly, the protruding portion 112 may be in easily surface contact with one surface of the bottom portion 131. However, the inner surface of the upper case 110 may be formed as a horizontal surface when capable of being in surface contact with one surface of the bottom portion 131.

Accordingly, at least one surface of the bottom portion 131 disposed inside the coupled body in which the upper case 110 and the lower cases 120 and 220 are coupled to each other may maintain a state of always coming into contact with the portion having a heat dissipation property and an insulation property.

Preferably, all of the upper case 110 and the lower cases 120 and 220 may be formed of a plastic material having a heat dissipation property and an insulation property. Accordingly, as shown in FIG. 3, in a case in which both surfaces of the bottom portion 131 of the bus bar disposed inside the coupled body come into contact with the upper case 110 and the lower cases 120 and 220, heat generated when the electric elements 10, 20, and 30 are operated may be released after being transferred to both sides of the upper case 110 and the lower cases 120 and 220.

Further, as shown in FIGS. 10 and 11, in a case in which an inner plate 140 configured to maintain an insulation property by blocking contact between the bus bars 130 is disposed between the upper case 110 and the lower cases 120 and 220, all of the upper case 110, the lower cases 120 and 220, and the inner plate 140 may be formed of a plastic material having a heat dissipation property and an insulation property. In this case, both surfaces of the bottom portion 131 of the bus bar disposed inside the coupled body may come into contact with the upper case 110 and the lower cases 120 and 220 or the upper case 110 and the inner plate 140. Further, both surfaces of the bottom portion 131 of the bus bar 130 disposed inside the coupled body may come into contact with the inner plate 140 and the lower cases 120 and 220. Accordingly, the heat generated when the electric elements 10, 20, and 30 are operated may be released after being simultaneously transferred to two parts among the upper case 110, the lower cases 120 and 220, and the inner plate 140.

The bus bar 130 may be electrically connected to the at least one among the electric elements 10, 20, and 30 mounted on one surface of the upper case 110.

To this end, the bus bar 130 may be formed of a conductor having low impedance and a large current capacity, and may serve to separately connect at least two among the electric elements 10, 20, and 30 or connect several isoquant points to distribute the power to various positions.

The above-described bus bar 130 may be provided in a plate-shaped bar shape having a predetermined length. Further, the bus bar 130 may include a portion bent at least once to be easily fastened to the electric elements 10, 20, and 30.

As an example, as shown in FIGS. 3 and 11, the bus bar 130 may include the bottom portion 131 provided in a plate-shaped shape having a predetermined area and at least one height portion 132 configured to extend from the bottom portion 131.

In this case, the bottom portion 131 may be a portion completely buried inside the coupled body in which the upper case 110 and the lower cases 120 and 220 are coupled to each other, the height portion 132 may be a portion configured to extend by a predetermined length from an end portion of the bottom portion 131, and the height portion 132 may include a portion configured to protrude to the outer side of the upper case 110 in order to be connected with the electric elements 10, 20, and 30 mounted on one surface of the upper case 110.

However, the overall shape of the bus bar 130 is not limited to the above and may be appropriately changed according to arrangement locations of the electric elements 10, 20, and 30 that are desired to be connected to each other.

A plurality of bus bars 130 may be provided and the plurality of bus bars 130 may be disposed so that the bottom portions 131 thereof may be located inside the coupled body in which the upper case 110 and the lower cases 120 and 220 are coupled to each other.

Further, at least some of the plurality of bus bars 130 may be connected to plus and minus terminals of the battery and plus and minus terminals of the inverter. Accordingly, the plurality of electric elements 10, 20, and 30 may block or connect the high-voltage currents supplied from the battery to the driving control part.

Figure 4:
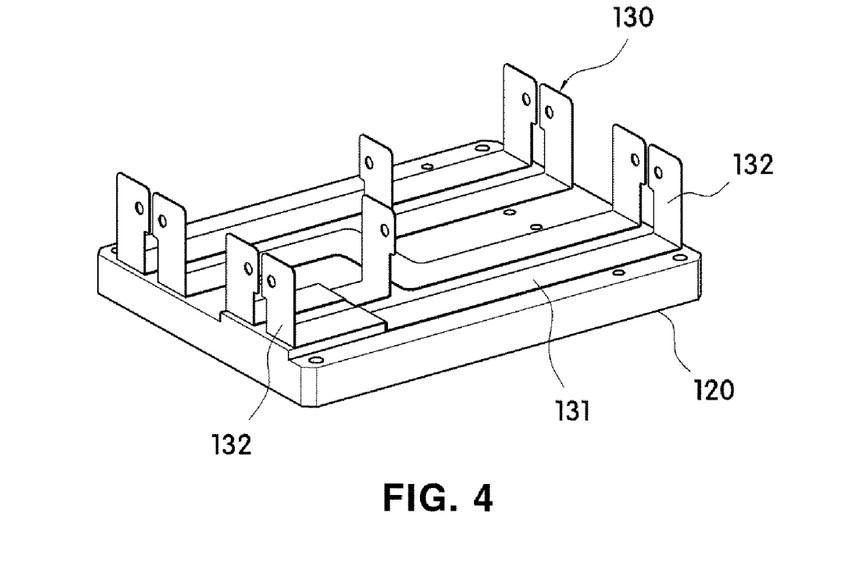
FIG. 4 is a view illustrating a state in which an upper case is removed in FIG. 1.
Figure 12:
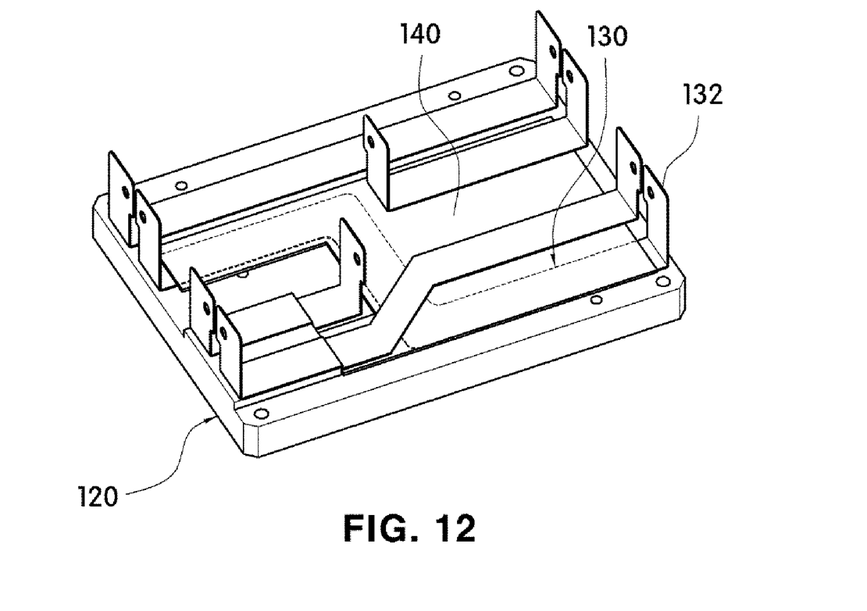
FIG. 12 is a view illustrating a state in which an upper case is removed in FIG. 9.

In this case, as shown in FIGS. 2 and 4, the plurality of bus bars 130 may be disposed so that the bottom portions 131 thereof disposed inside the coupled body in which the upper case 110 and the lower cases 120 and 220 are coupled to each other may not overlap each other, and as shown in FIGS. 10 and 12, the plurality of bus bars 130 may be disposed so that the bottom portions 131 thereof disposed inside the coupled body in which the upper case 110 and the lower cases 120 and 220 are coupled to each other may overlap each other.

Further, in a case in which some of the plurality of bus bars 130 are disposed so that the bottom portions 131 overlap each other inside the coupled body in which the upper case 110 and the lower cases 120 and 220 are coupled to each other, as shown in FIG. 9, the inner plate 140 configured to electrically insulate the overlapping bottom portions 131 may be disposed to be located between the overlapping bottom portions 131.

Here, as shown in FIGS. 2 and 9, the upper case 110 may include through holes 114 formed to pass through locations corresponding to the height portions 132 so that the height portions 132 of the bus bar may pass through the through holes 114. Further, as shown in FIG. 9, in a case in which the inner plate 140 is disposed between the upper case 110 and the lower cases 120 and 220, the inner plate 140 may include through holes (not shown) formed to pass through the locations corresponding to the height portions 132 so that the height portions 132 of the bus bar may also pass through the inner plate 140.

Accordingly, a lower surface of the bottom portion 131 completely buried inside the coupled body in which the upper case 110 and the lower cases 120 and 220 are coupled to each other may directly come into contact with inner surfaces of the lower cases 120 and 220 or an upper surface of the inner plate 140, and an upper surface of the bottom portion 131 may directly come into contact with the inner surface of the upper case 110 or a lower surface of the inner plate 140.

Accordingly, in a case in which portions of the upper case 110, the lower cases 120 and 220, and the inner plate 140 in surface contact with one surface of the bottom portion 131 are formed of a plastic material having a heat dissipation property, since heat generated when the electric elements 10, 20, and 30 and the bus bar 130 are operated may be easily released to the outside after being transferred to a portion formed of a plastic material having a heat dissipation property, performance degradation and damage of components due to heat can be prevented.

Further, in a case in which the upper case 110 and the lower cases 120 and 220 are coupled to each other, the plurality of bus bars 130 may be fixed because both surfaces of the plurality of bus bars 130 are in surface contact with the upper case 110 and the lower cases 120 and 220, the upper case 110 and the inner plate 140, or the inner plate 140 and the lower cases 120 and 220. Accordingly, the bus bars 130 may be fixed to the coupled body in which the upper case 110 and the lower cases 120 and 220 are coupled to each other even when separate fixing members are not used. Accordingly, in the power relay assemblies 100 and 200 according to the embodiment, since the separate fixing members configured to fix the bus bars 130 to the upper case 110 or the lower cases 120 and 220 are not necessary, space may be efficiently used and the assembly process may be simplified.

As a specific example, as shown in FIGS. 1 to 4, the plurality of bus bars 130 may be disposed so that the bottom portions 131 do not overlap each other. In this case, in the plurality of bus bars 130, when the upper case 110 and the lower cases 120 and 220 are coupled to each other, the upper surfaces of the bottom portions 131 may be in surface contact with the inner surface of the upper case 110 and the lower surfaces of the bottom portions 131 may be in surface contact with inner surfaces of the lower cases 120 and 220.

As another example, as shown in FIGS. 9 to 12, some of the plurality of bus bars 130 may be disposed so that the bottom portions 131 may have a height difference inside the coupled body in which the upper case 110 and the lower cases 120 and 220 are coupled to each other, and two bottom portions 131 disposed with different heights may be disposed to partially overlap each other. In this case, the inner plate 140 may be disposed between two bottom portions 131 disposed with different heights. Here, the inner plate 140 may be provided with at least one coupling portion 142 configured to protrude from an edge thereof, and since a fitting groove 122 with which the coupling portion 142 is fastened is formed on one surface of each of the lower cases 120 and 220, the inner plate 140 may be detachably coupled to the lower cases 120 and 220.

Accordingly, the bottom portions 131 of some of the plurality of bus bars 130 may be disposed between the upper case 110 and the inner plate 140, and the bottom portions 131 of other bus bars 130 may be disposed between the inner plate 140 and the lower cases 120 and 220. Further, the bottom portions 131 of some of the plurality of bus bars 130 may be disposed between the upper case 110 and the lower cases 120 and 220. In this case, since the inner plate 140 is formed of the plastic material having a heat dissipation property and an insulation property, electrical connection between two bottom portions 131 disposed to partially overlap each other may be blocked.

In this case, in the bus bars 130 having the bottom portions 131 disposed between the upper case 110 and the inner plate 140 among the plurality of bus bars 130, when the upper case 110 and the lower cases 120 and 220 are coupled to each other, the upper surface of the bottom portion 131 may be in surface contact with the inner surface of the upper case 110 and the lower surface of the bottom portion 131 may be in surface contact with the upper surface of the inner plate 140.

Further, in the bus bars 130 having the bottom portions 131 disposed between the inner plate 140 and the lower cases 120 and 220 among the plurality of bus bars 130, when the upper case 110 and the lower cases 120 and 220 are coupled to each other, the upper surface of the bottom portion 131 may be in surface contact with the lower surface of the inner plate 140 and the lower surface of the bottom portion 131 may be in surface contact with the inner surfaces of the lower cases 120 and 220.

In addition, in the bus bars 130 having the bottom portions 131 disposed between the upper case 110 and the lower cases 120 and 220 among the plurality of bus bars 130, like the above-described embodiment, the upper surface of the bottom portion 131 may be in surface contact with the inner surface of the upper case 110 and the lower surface of the bottom portion 131 may be in surface contact with the inner surfaces of the lower cases 120 and 220.

Meanwhile, in the above-described upper case 110, lower cases 120 and 220, and inner plate 140, only the portions configured to come into contact with the bottom portions 131 of the bus bars 130 may be formed of the plastic material having a heat dissipation property and an insulation property, and one part or two parts selected among the upper case 110, the lower cases 120 and 220, and the inner plate 140 may be entirely formed of the plastic material having a heat dissipation property and an insulation property. Preferably, all of the upper case 110, the lower cases 120 and 220, and the inner plate 140 may be formed of a plastic material having a heat dissipation property. Accordingly, since the overall heat capacity increases, the heat dissipation performance may be further improved.

Meanwhile, known heat transfer materials (not shown) may be provided on outer surface of the bottom portions 131 of the bus bars 130 disposed inside the coupled body in which the upper case 110 and the lower cases 120 and 220 are coupled to each other. The heat transfer materials may easily transfer the heat in the bus bars 130 to the upper case 110, the lower cases 120 and 220, or the inner plate 140 having a heat dissipation property, and thus the heat dissipation performance may be improved.

Figure 7:
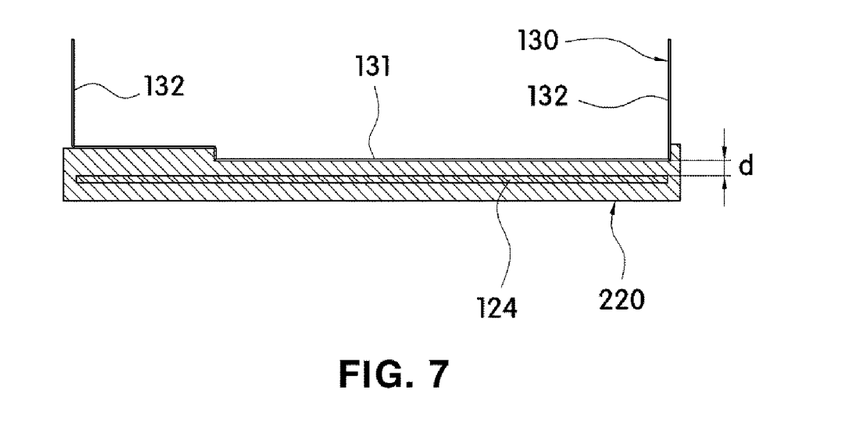
FIG. 7 is a cross-sectional view illustrating another shape of a lower case applicable to the power relay assembly according to the embodiment of the present invention.
Figure 8:
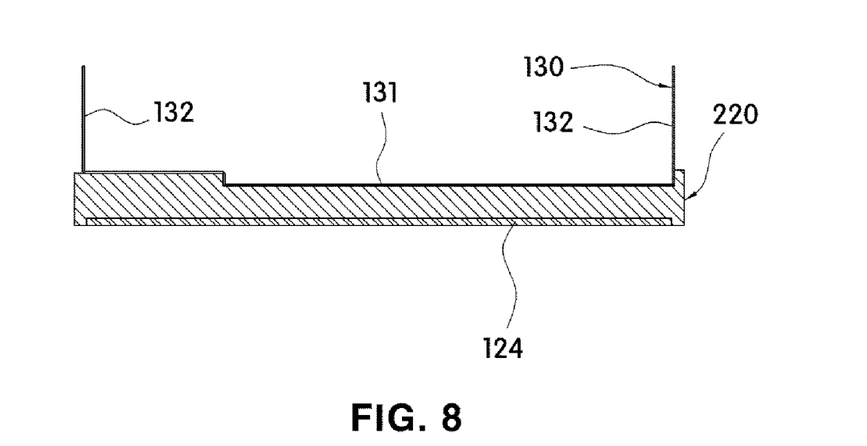
FIG. 8 is a cross-sectional view of still another shape of FIG. 7.

Further, as shown in FIGS. 7 and 8, the lower case 220 may include a plate-shaped metal member 124 having a predetermined area to maintain the heat dissipation performance and improve mechanical strength. In this case, the metal member 124 may have a shape that is entirely buried or partially buried in the lower case 220.

Accordingly, the lower case 220 may reinforce the mechanical strength through the metal member 124 and implement a desired heat dissipation performance.

Further, since the mechanical strength of the lower case 220 may be improved through the metal member 124, the lower case 220 may have a thin thickness even when the lower case 220 is made of an injection-molded material formed of a resin-forming composition having a heat dissipation property and an insulation property.

The above-described metal member 124 may be integrated with the lower case 220 through insert injection-molding.

In the present invention, the metal member 124 may be used without limitation as long as it is made of a metal material having predetermined thermal conductivity. As an unlimited example, the metal member 124 may be one metal selected from the group consisting of aluminum, magnesium, iron, titanium, and copper or an alloy including at least one metal.

The above-described metal member 124 may be buried inside the lower case 220 so that an entire surface thereof may be completely surrounded by the lower case 220, or may have a shape having one surface disposed on one surface of the lower case 220 to be exposed to the outside.

In this case, the metal member 124 may be surface-treated so that an interface with the lower case 220 formed of a plastic material having an insulation property and a heat dissipation property is not separated after insert-molding. Accordingly, the lower case 220 may increase a coupling force to the metal member 124.

Alternatively, a nano-sized fine groove having a predetermined pattern may be formed on at least one surface of the metal member 124 to improve a coupling force between the metal member 124 and the lower case 220.

Meanwhile, in a case in which the lower case 220 includes the metal member 124, the metal member 124 may be disposed to maintain a predetermined interval d with the lower surface of the bottom portion 131 configured to come into contact with the inner surface of the lower case 220. That is, as shown in FIG. 7, the metal member 124 may be partially or entirely buried in the lower case 220 while the metal member 124 maintain the predetermined interval d with the bottom portion 131 of the bus bar 130 and.

As a specific example, a separation distance between the metal member 124 and the bottom portion 131 of the bus bar 130 may have an interval of 1 mm or more, to maintain the insulation property and satisfy a desired withstand voltage property.

In the present invention, as described above, the metal member 124 may be a plate-shaped metal plate having a predetermined area. However, the metal member 124 is not limited thereto, and may be provided in a bar shape having a predetermined aspect ratio. Further, the metal member 124 may be provided in a mesh type having a closed-loop shaped edge such as a quadrangular or circular shaped edge and in which a plurality of wires or bars are disposed to be spaced apart from each other at a predetermined interval on the inside of the edge. In a case in which the metal member 124 is provided in the mesh type, the plurality of wires or bars are disposed on the inside of the edge may be disposed to form a parallel structure, a lattice structure, a honeycomb structure, and various structures in which the above are combined.

Although the drawings and descriptions show and describe that the metal member 124 is included in only the lower case 220, the present invention is not limited thereto, and a metal member 124 in shapes shown in FIGS. 7 and 8 may also be applied to the upper case 110 and/or the inner plate 140 in the same manner.

Meanwhile, the plastic having a heat dissipation property and an insulation property used to configure the upper case 110, the lower cases 120 and 220, and the inner plate 140 may have a shape in which insulating heat dissipation fillers are dispersed on a polymer matrix.

As an example, the polymer matrix may be used without limitation when implemented into a polymer compound which does not hinder the dispersibility of the heat dissipation fillers and is injection-moldable. As a specific example, the polymer matrix may be a known thermoplastic polymer compound, and the thermoplastic polymer compound may be a compound selected from the group consisting of polyamide, polyester, polyketone, a liquid crystal polymer, polyolefin, polyphenylene sulfide (PPS), polyether ether ketone (PEEK), polyphenylene oxide (PPO), polyethersulfone (PES), polyetherimide (PEI), and polyimide or a mixture or copolymer of at least two among the above group.

Further, all insulating heat dissipation fillers may be used without limitation when having both an insulation property and a heat dissipation property. As a specific example, the insulating heat dissipation filler may include at least one selected from the group consisting of magnesium oxide, titanium dioxide, aluminum nitride, silicon nitride, boron nitride, aluminum oxide, silica, zinc oxide, barium titanate, strontium titanate, beryllium oxide, silicon carbide, and manganese oxide.

Further, the insulating heat dissipation filler may be porous or nonporous, and may also be a core shell type filler in which a known conductive heat dissipation filler such as a carbon-based filler, a metal filler, or the like is used as a core and insulating ingredients surround the core.

In addition, in the case of the insulating heat dissipation filler, a surface may be modified with a functional group such as a silane group, an amino group, a hydroxyl group, a carboxyl group, or the like to improve the surface bonding force with the polymer matrix by improving wettability or the like.

However, the plastic having an insulation property and a heat dissipation property useable to the present invention is not limited thereto and all plastic having both an insulation property and a heat dissipation property may be used without limitation.

Meanwhile, the power relay assembly 100 according to the embodiment of the present invention may further include a protection coating layer 150.

Figure 6:
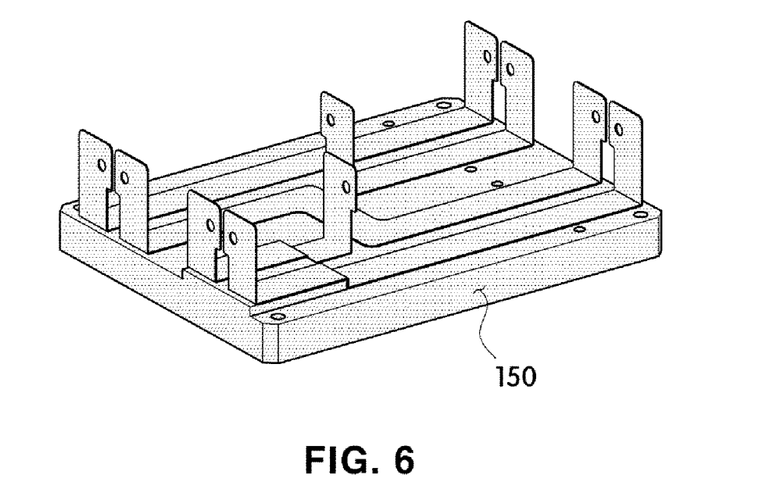
FIG. 6 is a view illustrating a state in which a coating layer is coated on an outer surface in FIG. 4.

As shown in FIG. 6, the protection coating layer 150 may be formed to cover all outer surfaces of the upper case 110, the lower cases 120 and 220, and the bus bars 130. Further, the protection coating layer 150 may also cover all outer surfaces of the electric elements 10, 20, and 30 mounted on one surface of the upper case 110. However, the coated location of the protection coating layer 150 is not limited thereto, and the protection coating layer 150 may be coated on only the outer surfaces of the upper case 110 and the lower cases 120 and 220 and coated on only the outer surfaces of the bus bars 130. Further, the protection coating layer 150 may be identically applied to the power relay assembly 200 shown in FIGS. 9 to 13.

The above-described protection coating layer 150 may prevent scratches due to physical stimuli applied to the surfaces of the upper case 110, the lower cases 120 and 220, and the bus bars 130 and further improve the insulation property of the surfaces.

Further, in a case in which the upper case 110, the lower cases 120 and 220, and the inner plate 140 are formed of plastic on which the insulating heat dissipation fillers are dispersed, the protection coating layer 150 may serve to prevent separation of the insulating heat dissipation fillers located on the surfaces.

As an example, the protection coating layer 150 may be implemented into a known thermosetting polymer compound or a thermoplastic polymer compound. The thermosetting polymer compound may be a compound selected from the group consisting of an epoxy-based resin, a urethane-based resin, an ester-based resin, and a polyimide-based resin, or a mixture or copolymer of at least two in the above group. Further, the thermoplastic polymer compound may be a compound selected from the group consisting of the polyamide, polyester, polyketone, a liquid crystal polymer, polyolefin, polyphenylene sulfide (PPS), polyether ether keton (PEEK), polyphenylene oxide (PPO), polyethersulfone (PES), polyetherimide (PEI), and polyimide or a mixture or copolymer of at least two among the above group, but may not be limited thereto.

Meanwhile, since the protection coating layer 150 is coated on outer surfaces of the power relay assemblies 100 and 200, the protection coating layer 150 can interfere with dissipation of the heat transferred to the upper case 110, the lower cases 120 and 220, and the inner plate 140 to the outside. To solve this problem, the protection coating layer 150 applied to the present invention may further include insulating heat dissipation fillers to improve the characteristic of dissipating heat to the outside. The insulating heat dissipation fillers may be used without limitation in the case of the known insulating heat dissipation fillers.

As an example, the protection coating layer 150 may include insulating heat dissipation fillers dispersed on the polymer matrix to have both a heat dissipation property and an insulation property.

In this case, the insulating heat dissipation fillers included in the protection coating layer 150 may be the same as the insulating heat dissipation fillers in the upper case 110, the lower cases 120 and 220, and the inner plate 140 and different from the insulating heat dissipation fillers in the upper case 110, the lower cases 120 and 220, and the inner plate 140.

Meanwhile, as described above, the bus bars 130 applied to the present invention may be formed of a conductor having low impedance and a large current capacity. As a specific example, the bus bars 130 may be formed of a metal material such as copper or aluminum.

Figure 14:
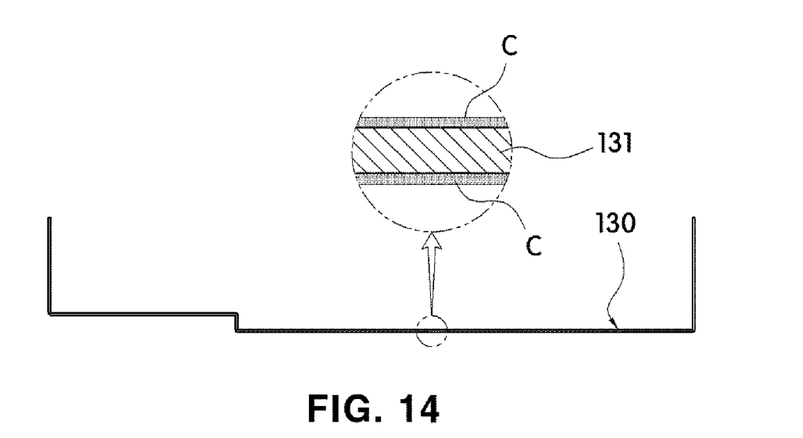
FIG. 14 is a cross-sectional view illustrating a bus bar applicable to the power relay assembly according to an embodiment of the present invention, and is a view illustrating circumstances in which a coating layer is coated on a surface of the bus bar.

Here, in a case in which the bus bars 130 are formed of an aluminum material, as shown in FIG. 14, each of the bus bars 130 may include a heat dissipation coating layer C including the insulating heat dissipation fillers on a surface thereof, and contents that are the same as contents applied to the protection coating layer 150 may be applied to the heat dissipation coating layer C.

That is, in a case in which the bus bars 130 are formed of an aluminum material, the bus bar 130 may have less weight than the bus bar 130 made of a copper material because aluminum has a less specific gravity than copper, due to the characteristics of the materials. Accordingly, the power relay assembly in which aluminum is used for the material of the bus bars 130 may have a much less weight than the power relay assembly in which copper is used for the material of the bus bars 130.

On the other hand, since aluminum has a lower heat conductivity than copper, due to the characteristics of the materials, in a case in which both are manufactured in the same size, the bus bar made of aluminum may have inferior heat dissipation performance and should be manufactured in a large thickness to implement a heat dissipation performance similar to that of the bus bar made of copper.

In the present invention, to solve this problem, in a case in which the bus bars 130 are formed of an aluminum material, since the heat dissipation coating layer C including the insulating heat dissipation fillers may be formed on the surface of the bus bar 130 to supplement the heat dissipation performance, a heat dissipation performance similar to that of the bus bar formed of the copper material may be implemented even when the thickness may minimally increase compared to when the bus bars are formed of a copper material.

Accordingly, the power relay assembly in which aluminum is used for the material of the bus bars 130 may be lightened compared to the power relay assembly in which copper is used for the material of the bus bars 130, and manufacturing costs may be reduced.

As an unlimited example, the bus bar formed of an aluminum material may have a thickness about 1.5 times that of the bus bar formed of a copper material having the same shape to implement similar heat dissipation performance.

However, in a case in which the heat dissipation coating layer C including the above-described insulating heat dissipation fillers is formed on the surface of the bus bar, the bus bar formed of an aluminum material and having the heat dissipation coating layer C including the insulating heat dissipation fillers formed on the surface thereof may implement a heat dissipation performance similar to that of the bus bar formed of a copper material even when having a thickness 1.3 times that of the bus bar formed of a copper material.

However, the material used for the bus bar 130 is not limited thereto and is not limited for a conductor having low impedance and a large current capacity.

Meanwhile, the power relay assemblies 100 and 200 according to the embodiment of the present invention may further include at least one cover (not shown) to prevent exposure of the electric elements 10, 20, and 30 and the bus bar 130 to the outside and protect the electric elements 10, 20, and 30 and the bus bar 130 from the external environment.

The above-described cover may be directly fastened to the upper case 110 or the lower cases 120 and 220 and may be fastened to brackets (not shown) separately provided on an edge of the upper case 110 or edges of the lower cases 120 and 220. Further, the cover may have a box shape of which one side is open, but is not limited thereto, and the cover may be formed of one member, and a plurality of components may be assembled to each other to configure one box.

In addition, the cover may be formed of a general plastic material having an insulation property but may also be formed of a plastic material having a heat dissipation property and an insulation property.

Although one embodiment of the present invention is described above, the spirit of the present invention is not limited to the embodiment shown in the description, and although those skilled in the art may provide other embodiments through the addition, change, or removal of the components within the scope of the same spirit of the present invention, such embodiments are also included in the scope of the spirit of the present invention.

The invention claimed is:

1. A power relay assembly comprising:
   an upper case in which at least one electric element is mounted on one surface thereof;
   a lower case coupled to the upper case; and
   at least one bus bar electrically connected to the electric element, disposed between the upper case and the lower case, and including a bottom portion in surface contact with the upper case and the lower case,
   wherein the upper case and the lower case are formed of a plastic material having a heat dissipation property and an insulation property,
   wherein one surface of the bottom portion is in surface contact with an inner surface of the upper case and an opposite surface of the bottom portion is in surface contact with an inner surface of the lower case, wherein the inner surface of the upper case in surface contact with the bottom portion is a protruding portion configured to protrude by a predetermined height, and wherein the protruding portion is formed to correspond to a shape of the bottom portion.

2. The power relay assembly of claim 1, wherein the bus bar includes the bottom portion and at least one height portion configured to extend from the bottom portion to protrude to an outer side of the upper case.

3. The power relay assembly of claim 1, wherein the bottom portion is formed in a plate shape having a predetermined area.

4. The power relay assembly of claim 1, further comprising an inner plate disposed between the upper case and the lower case, wherein a plurality of bus bars are provided and some bus bars among the plurality of bus bars are disposed at a location in which bottom portions thereof partially overlap each other, and the inner plate is disposed to be located between the bottom portions of the overlapping bus bars.

5. The power relay assembly of claim 4, wherein the inner plate is formed of a plastic material having a heat dissipation property and an insulation property.

6. The power relay assembly of claim 4, wherein in each of the bus bars disposed at the location in which bottom portions thereof partially overlap each other among the plurality of bus bars, both surfaces of the bottom portion are in surface contact with one surface of the inner plate and one surface of the upper case or one surface of the inner plate and one surface of the lower case.

7. The power relay assembly of claim 1, wherein:

at least one of the upper case and the lower case includes a plate-shaped metal member; and the metal member is integrated with the upper case or the lower case, wherein the upper case or lower case is formed of a resin-forming composition having a heat dissipation property and an insulation property through insert-molding.

8. The power relay assembly of claim 7, wherein the metal member is completely buried inside the upper case or the lower case or fixed to one surface of the upper case or the lower case so that the one surface thereof is exposed to the outside.

9. The power relay assembly of claim 1, wherein a coating layer having an insulation property and a heat dissipation property is formed on an exposed surface of the power relay assembly.

10. The power relay assembly of claim 1, wherein the bus bar is formed of an aluminum material and has a coating layer having an insulation property and a heat dissipation property formed on a surface thereof.

* * * * *